COUNTER STEP-DOWN FREQUENCY SYNTHESIZER

Filed Nov. 23, 1966 2 Sheets-Sheet 1

INVENTOR.
TEX C. THOMAS
BY
Moody & Anderson
AGENTS

COUNTER STEP-DOWN FREQUENCY SYNTHESIZER

Filed Nov. 23, 1966 2 Sheets-Sheet 2

INVENTOR.
TEX C. THOMAS
BY Moody & Anderson
AGENTS 3,354,403

COUNTER STEP-DOWN FREQUENCY SYNTHESIZER

Tex C. Thomas, Garland, Tex., assignor to Collins Radio Company, Cedar Rapids, Iowa, a corporation of Iowa Filed Nov. 23, 1966, Ser. No. 599,341
10 Claims. (Cl. 331—18)

This invention relates generally to frequency synthesis and more particularly to improvement in digital frequency synthesizers of the type employing a voltage controlled oscillator in a digitally controlled, phase locked feedback control loop wherein the frequency of the voltage controlled oscillator is the controlled variable. A typical digital frequency synthesizer is utilized to generate a plurality of output frequencies in precisely controlled steps. The frequency synthesizer employs a phase locked loop including means by which the output frequency is divided down to a feedback frequency which corresponds to the output frequency steps. The feedback frequency is compared with a reference frequency in a phase comparator and the output of the phase comparator controls the voltage controlled oscillator (the controlled variable in the loop) to generate the output frequency as one of the predetermined number of step frequencies. The selection of output frequencies is effected by setting a corresponding countdown factor into the loop feedback divider.

Assuming that the phase comparison in such a typical loop is to be made at 1 kc., the counter within the loop is set to divide the output frequency and phase of the voltage controlled oscillator by a factor N such that the output of the counter is a series of pulses having a repetition rate of 1 kc. The counter output pulse train is phase compared with the reference pulse train and any phase discrepancy therebetween developes a DC control voltage which controls the frequency of the oscillator and locks the oscillator frequency at the selected integer multiple of the reference.

The type of frequency synthesizer to which the present invention pertains is described in copending application, Serial Number 580,138, filed Aug. 23, 1966 by Douglas R. Brase, et al. entitled "Phase Comparator For Use in Frequency Synthesizer Phase Locked Loop," now Patent No. 3,337,814, and assigned to the assignee of the present invention.

From the above general description, it is apparent that, for a given operating range, the highest operating frequency at which the voltage controlled oscillator is to be operated in turn defines the highest countdown ratio to be set into the divider and further establishes the maximum operating frequency at which the divider must function. For certain applications, the highest operating frequency might be incompatible with the maximum rate at which a binary counter may operate. It is an object, therefore of the present invention to provide an improved synthesizer loop of the type generally above described wherein the highest operating frequency at which the counter is to operate is reduced to a lower and more practical frequency without affecting phase lock within the loop, or the output frequency step separations.

Further, for certain applications, a wide range or multiple octave frequency range may be desired to be covered by the synthesizer. There is, of course, a limitation of the frequency operating range of any given voltage controlled oscillator. A further object of the present invention is the provision of an improvement in frequency synthesizer loops by means of which the frequency range of the voltage controlled oscillator or oscillators in a multiple octave operating range need not cover the entire range, thus, permitting the incorporation of a voltage controlled oscillator or oscillators to cover but one octave within the operating band, yet permit generation of output frequencies throughout the remaining octaves in the overall operating band. The latter object is featured in the provision of means whereby the basic oscillator frequency is further appropriately divided, with loop feedback for application to the divider being taken from the loop output rather than from the voltage controlled oscillator per se.

These and other features and objects of the present invention will become apparent upon reading the following description in conjunction with the accompanying drawings in which.

Figure 1:
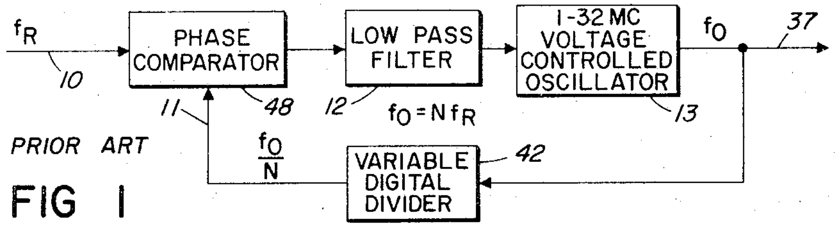
PRIOR ART FIG 1
FIGURE 1 is a functional block diagram of a basic digital frequency synthesizer as currently known in the art.

The present invention may best be comprehended by consideration of the basic frequency synthesizer loop as depicted functionally in FIGURE 1.

The basic loop is seen to comprise a phase comparator 48 to which is applied a reference frequency 10 and a second input 11, the latter being the output from a variable digital divider 42. Any phase discrepancy between the reference frequency 10 and the divider output 11 reflects in a direct current output of the phase comparator 48, which is applied through low pass filter 12 as a control voltage for the voltage controlled oscillator 13. Oscillator 13 generates the output frequency 37 which is further applied as input to the variable digital divider 42. The controlled variable in the basic system of FIGURE 1 is the frequency of the output signal 37. The oscillator 13 of FIGURE 1 functions as a digitally controlled phase locked oscillator. This type of synthesizer is well defined in the art and is basically a phase locked loop with the frequency of the voltage controlled oscillator 13 being the controlled variable. The loop uses a very stable reference frequency 10 as the reference input and the phase comparator 38 is the error detecting device. The feedback in the loop is the frequency of the oscillator 13 and the variable digital divider 42 in the feedback path is the control device for selecting the desired operating frequency.

Assuming that the basic loop is to cover a range from 1–32 megacycles, the voltage controlled oscillator 13 may comprise a single oscillator to cover the entire mc. range or alternatively, a plurality of the oscillators to cover the range together with appropriate switching control, and further the variable digital divider 42 must operate at a maximum frequency of 32 mc. The complexity of the digital counters employed in such dividers increases with higher operating frequencies. For certain applications the highest operating frequency may exceed that at which known binary counters can function reliably.

In operation, the system of FIGURE 1 necessitates that the digital divider be set for an integer division ratio equal to the output frequency $f_0$ of the voltage controlled oscillator 13 divided by the reference frequency $f_R$, that is, the division ratio N equals $f_0/f_R$. The output frequency $f_0$ may then be defined as $f_0=Nf_R$, where $f_R$ is the reference frequency. Now, if the reference frequency $f_R$ in a given arrangement is assumed to be 1000 c.p.s., and N, the divider countdown factor, is set for 29,000, the output frequency, $f_0$, equals 29,000 (1000 c.p.s.), or 29 megacycles.

From the above it is seen that an output frequency at the extreme range, for example, 32 mc., requires a countdown factor of 32,000 to be set into the divider, and a maximum divider operating frequency of 32 mc. is required.

Further, for the illustrated example, the basic system of FIGURE 1 requires the voltage controlled oscillator to cover the entire output range from 1–32. The present invention provides an improved system permitting the voltage controlled oscillator to cover only the highest octave within the operating band. For the example under consideration, the present invention would require the oscillator to cover the octave from 16–32 megacycles.

Figure 2:
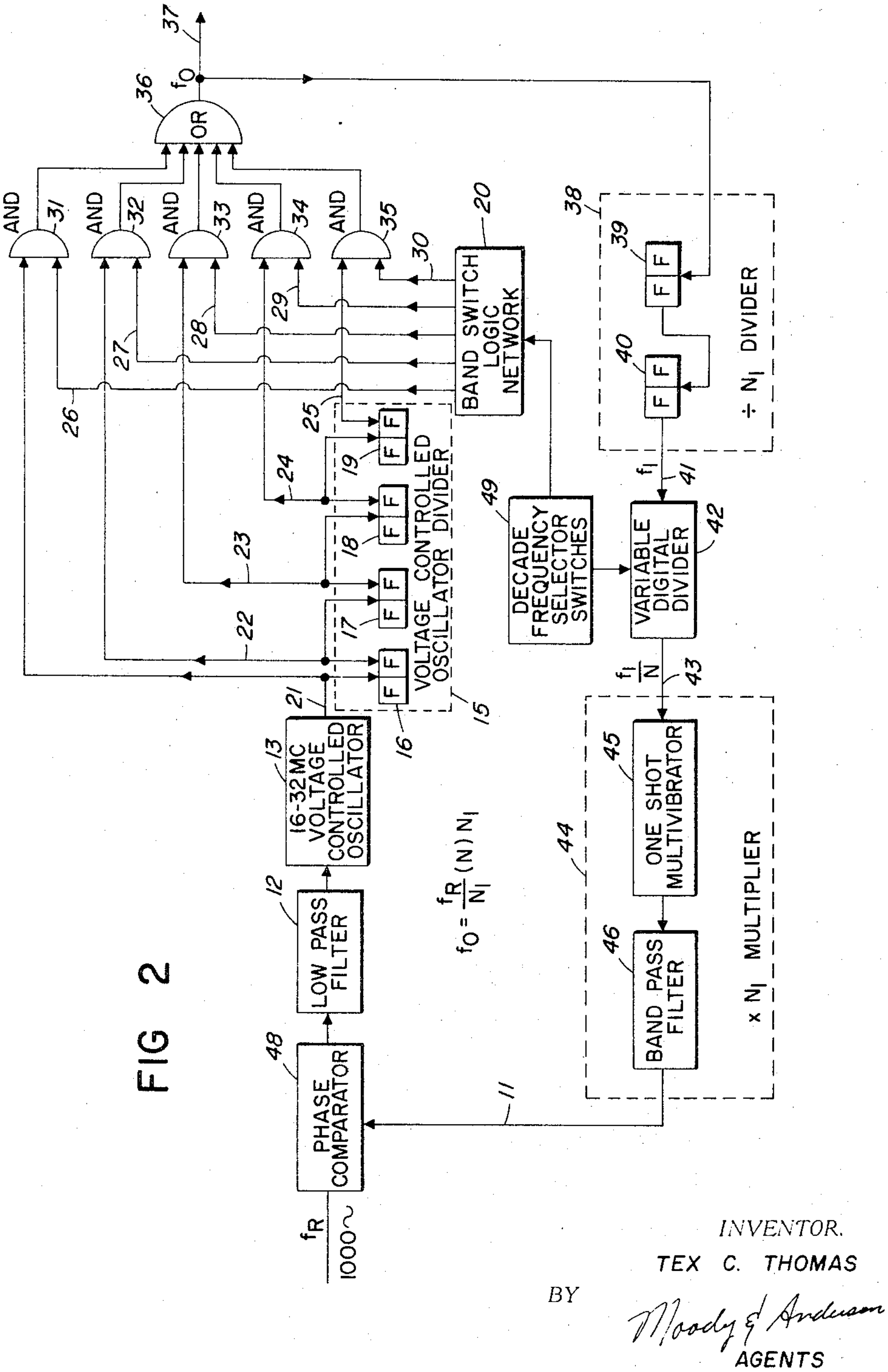
FIGURE 2 is a functional block diagram of an improved frequency synthesizer in accordance with the present invention.

The present invention is depicted functionally in the block diagram of FIGURE 2. Functions within the loop of FIGURE 2, corresponding with those in FIGURE 1 are identified by like reference numerals. The loop of FIGURE 2 is seen to comprise the phase comparator 48 which receives an input reference pulse train 10 identified as $f_R$ together with the feedback pulse train 11 which corresponds to the synthesizer output frequency 37 divided down by the variable digital divider 42, with the divider 42 being preceded by a fixed divider and followed by a fixed multiplier.

As in the basic system, the output of phase comparator 48 is applied through low pass filter 12 from which is developed a direct current voltage to control the operating frequency of the voltage controlled oscillator 13. Unlike the basic loop, the output of the voltage controlled oscillator is not directly taken as the synthesizer output 37. The output from the voltage controlled oscillator 13 is applied instead to the VCO divider 15 and additionally as a first input to an AND gate 31. Outputs 22, 23, 24 and 25 from successive stages of the VCO divider 15 are likewise applied as first inputs to AND gates 32, 33, 34, and 35, respectively. Second inputs to the AND gates 31–35 are applied from a band switch logic network 20 on lines 26–30 respectively. The band switch logic circuitry might comprise any one of a number of expedients to selectively generate a gating voltage on one of lines 26–30 depending upon which octave within the over-all operating band is selected.

The output from the AND gates 31–35 are applied as common inputs to an OR gate 36, the output of which corresponds to the output 37 from the frequency synthesizer. The output from OR gate 36 is additionally applied back through the feedback of the synthesizer which, in accordance with the present invention, includes the variable digital divider 42 as in the basic system of FIGURE 1. However, the divider 42 is preceded by an additional fixed divider 38 and followed by a fixed multiplier 44.

The manner in which the synthesizer of FIGURE 2 permits a reduced operating frequency requirement as concerns the variable digital divider 42 in the feedback loop, may best be comprehended by consideration of operation in what will be termed "Band 1," covering the highest octave within the operating band. For the assumed example of operation from 1–32 mc., operation in band 1 implies that a gating voltage 26 is developed in the band switch logic circuitry 20 so as to permit the voltage controlled output 21 to pass through AND gate 31 and OR gate 36 to the output 37. Operation in band 1 accordingly implies that no such gating voltages from the band switch logic circuitry 20 are applied to the remaining AND gates, and thus, the direct output from the voltage controlled oscillator 13 is applied to the output 37 in a manner analogous to the basic system of FIGURE 1. If the output 37 is designated $f_0$, the fixed divider is dividing by $N_1$, the variable digital divider is dividing by a factor N, and the fixed multiplier 44 is multiplying by a fixed factor of $N_1$, the output frequency may be expressed as:

$$f_0=\frac{f_R N_1}{N_1 N}$$

From the above relationship it is apparent that the factors $N_1$ cancel and thereby have no effect on the output frequency $f_0$. They accordingly have no effect on the frequency tuning steps involved in a given embodiment, nor do they affect the countdown of N affected by the variable digital divider 42. For example, assuming the above described consideration of frequency steps of 1000 c.p.s., it was noted that if the counter 42 were set to divide by $N=29{,}000$, the output 37 would be 29 mcs. The above expression for the output frequency of the synthesizer of FIGURE 2, in that the factors $N_1$ cancel, is seen to likewise establish the same required countdown factor N in the divider 42 to arrive at the exampled output frequency of 29 mcs. Note, however, that for this given example, the output frequency $f_0$ of 29 mc. is divided by fixed divider 38 prior to application to variable digital divider 42. Thus, assuming a fixed dividing factor $N_1=4$ in divider 38, the output 41 from the divider 38 is 7.25 megacycles. The highest operational frequency applied to the counter in band 1, for the example of 1–32 mc. operation would accordingly be one-fourth of the highest operating frequency or 8 megacycles rather than 32 megacycles. The counter 42 is set to divide by the same factor N as in the basic loop of FIGURE 1, however the frequency of output 43 from variable digital divider 42 is one-fourth that of the 1000 c.p.s. output steps or 250 cycles. For any selected output frequency in band 1, the variable digital divider 42 would be set, as in the basic loop, for a dividing factor N such that the output 43 would be one-fourth of the output step. The output 43 from divider 42 is then applied to multiplier 44 for multiplication by the same factor $N_1$ to restore the loop feedback signal 11 to the system reference frequency for phase comparison.

For any given selected frequency, the inclusion in the feedback loop of the fixed divider 38 preceding the digital divider 42 and the fixed multiplier 44 following divider 42 reduces the highest frequency at which the digital divider 42 must operate by the factor $N_1$ corresponding to the dividing and multiplying factors of divider 38 and multiplier 44. Although a fixed dividing and multiplying factor $N_1$ of four has been exampled, any convenient factor $N_1$ might be chosen. The dividing ratio of divider 38 and the multiplying factor of multiplier 44 might, for example, be chosen to be eight, in which case the highest frequency at which the digital divider 42 must operate would be reduced to one-eighth the highest output frequency 37 from the loop.

As employed in FIGURE 2, the fixed divider 38 comprises a two stage counter to provide a countdown of four. The implementation of multiplier 44, which receives the output of digital divider 42, is simplified by the fact that the output from the counter 42 is a constant frequency under phase locked conditions. A practical multiplier is functionally illustrated in FIGURE 2 as being comprised of a one-shot multivibrator 45 having a duty cycle set for maximum harmonic content at the desired multiplication ratio. The one-shot multivibrator 45 is followed by a band pass filter 46 which selects the desired harmonic as the feedback 11 to the phase comparator 48.

The description of the synthesizer of FIGURE 2 has been described with respect to operation within one given frequency band. The manner in which the system permits the use of but a single voltage controlled oscillator covering only highest octave of the over-all operating band, becomes apparent from a consideration of the function of the VCO divider 15 in conjunction with the further AND gates 32–35 and the band switch logic circuitry 20. For the high band operation described above, band switch logic circuitry 20 activated only AND gate 31, which in effect, removed the VCO divider 15 from any function within the loop, with the output from the voltage controlled oscillator 13 being applied directly as the synthesizer output 37 which in turn was additionally applied to the feedback portion of the loop.

Consider now operation within band 2, which covers the next highest octave. In the exampled system the octave would be 8 to 16 mc. Band switch logic circuitry 20 would provide an enabling gate on line 27 to AND gate 32 and the output from the first flip-flop section 16 of the VCO divider 15 passed through AND gate 32 and OR gate 36 as the synthesizer output frequency 37. The first flip-flop section 16 of the voltage controlled oscillator divider 15 provides an output 22, corresponding to the voltage controlled oscillator frequency divided by two. Thus, for operation in band 2, the voltage controlled oscillator 13, in response to a particular selected frequency (dividing factor N) being set in the variable divider 42, continues to develop outputs within the high octave (16–32) band. However, the output from voltage controlled oscillator is halved before being applied to the output 37 of the synthesizer. The loop functions as before to maintain phase lock at the selected step output intervals of, for example, 1000 cycles.

Similarly, outputs from succeeding flip-flop sections of the VCO divider 15 are applied to AND gates 33, 34, and 35, respectively, to obtain output frequencies in the successively lower octaves within the over-all operating frequency range. The output 23 from flip-flop 17 divides the voltage controlled oscillator output by a factor of four which is passed through AND gate 33 when enabled by band 3 logic, the output 37 then corresponding to one-fourth the operating frequency of the voltage controlled oscillator 13. Thus, band 3 effects operating frequencies in the range from 4–8 megacycles. Output 24 from flip-flop 18 represents a division of the voltage controlled oscillator frequency by a factor of eight and, in conjunction with enabled AND gate 34, passes output frequencies in the range from 2–4 mc. to the output 37. The lowest octave is realized by the output 25 from the final flip-flop 19 of the VCO divider 15 being applied to AND gate 35 so as to divide output frequency of voltage controlled oscillator 13 divider by a factor of sixteen to obtain output frequencies in the range of from 1–2 megacycles.

The logic by means of which the appropriate one of the gates 31–35 is enabled so as to select a predetermined divided output from the voltage controlled oscillator 13 may be accomplished electronically within the band switch logic network 20 of FIGURE 2 under control of the settings of the frequency selector switches 49.

Figure 3:
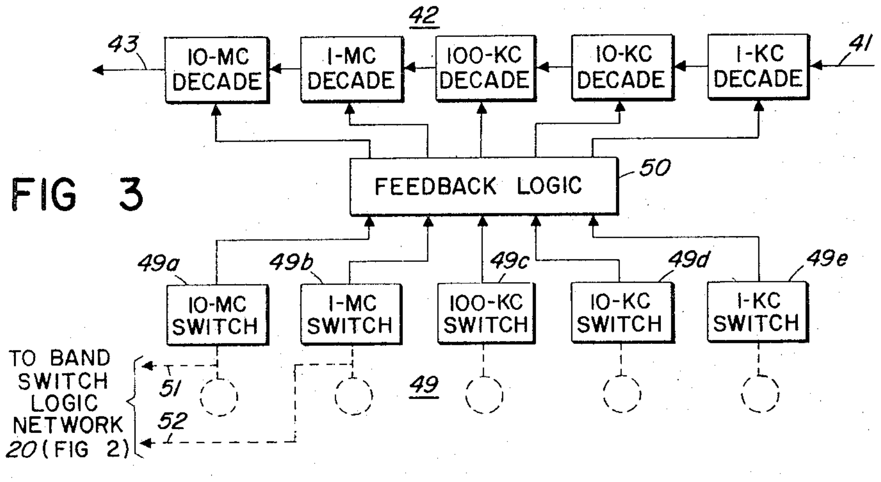
FIGURE 3 is a functional block diagram of a variable digital divider which may be used in the synthesizer of FIGURE 2.

The variable digital divider 42 in the feedback logic in an actual embodiment might comprise a chain of decade dividers such as illustrated in FIGURE 3. The frequency selector switches would comprise a decade switch for each of the significant digits involved in the over-all operating range of frequencies. For the exampled range of 1–32 megacycles, the embodiment would include a 10-mc. switch, a 1-mc. switch, a 100-kc switch, a 10-kc. switch and a 1-kc. switch. Each of the decade switches **49*a*–49*e* would tie into a feedback logic network 50 to affect the necessary modification of the decade counter in the digital divider 42 such that the count being affected is directly readable in terms of the positions of the decade switches 49*a*–49*e*. This type of divider control is well known in the art. By employing a decade counter chain, the output 37 from the frequency synthesizer can be selected by directly readable switch positions. For example, the selection of an output frequency 29.000 mcs. would be effected by positioning decade switch 49*a* to position 2, decade switch 49*b* to position 9, and the remaining decade switches 49*c* through 49*e* to respective zero positions. The selected frequency is then directly readable from the switch positions in 0.001 megacycle increments, considering a decimal point to follow the readout position of the 1-mc. switch 49*b***.

The band switch logic 20 may then be formulated from a consideration of significant digits of the readout of the 10-mc. selector switch **49*a* and the 1-mc. selector switch, 49*b***. Each selected band defines one octave within the over-all range.

Table I, below illustrates the five bands under consideration, as they might be defined in an actual embodiment.

TABLE I

| Band | Frequency, mc. | 10-mc. switch positions | 1-mc. switch positions |
|---|---|---|---|
| 5 | 1.000→ 1.999 | 0 | 1 |
| 4 | 2.000→ 3.999 | 0 | 2, 3 |
| 3 | 4.000→ 7.999 | 0 | 4, 5, 6, 7 |
| 2 | 8.000→ 9.999 | 0 | 8, 9 |
| | 10.000→15.999 | 1 | 0, 1, 2, 3, 4, 5 |
| 1 | 16.000→19.999 | 1 | 6, 7, 8, 9 |
| | 20.000→29.999 | 2 | all |
| | 30.000→32.000 | 3 | 0, 1, 2 |

From Table I, band 5 is seen to define output frequencies in the range from 1–1.999 mc., band 4 from 2.000 to 3.999 mc., etc. Band 2 would cover 8.000 to 15.999 mc. and is illustrated in the table as two successive ranges within the band 2 octave. Similarly, band 1 would cover from 16 to 32.000 mcs. and is illustrated in the table as three successive ranges within the band 1 octave. Table I further illustrates the 10-mc. and 1-mc. frequency selector switch positions to effect the particular frequencies. All selected frequencies within band 5 would define a 10-mc. switch position of zero and a 1-mc. switch position of 1. Within band 4, all 10-mc. switch positions would again be zero and 1-mc switch positions of either two or three would be realized. In band 3, all selected frequencies would be effected by a zero position of the 10-mc. switch and 1-mc. switch positions of either 4, 5, 6 or 7. Within the range of 8.000–9.999-mc. in band 2, all selected frequencies would be effected by the zero position of the 10-mc. switch and 1-mc. switch positions of either 8 or 9. Within the second range of band 2 from 10.000–15.999 mc., all selected frequencies would be effected by placing the 10-mc. switch on position 1 and the 1-mc. switch on either of positions 0, 1, 2, 3, 4 or 5. Within the range from 16.000 to 19.999 of band 1, all selected frequencies would be effected by position 1 of the 10-mc. switch and positions 6, 7, 8 or 9 of the 1-mc. switch. Within the range of 20.000 to 29.999 of band 1, all frequencies would be selected by position 2 of the 10-mc. switch together with all the decade positions 0–9 of the 1-mc. switch. Finally, within the range from 30,000 to 32,000 of band 1, all selected frequencies would be effected by position 3 of the 10-mc. switch and positions 0, 1 or 2 of the 1-mc. switch.

Figure 4:
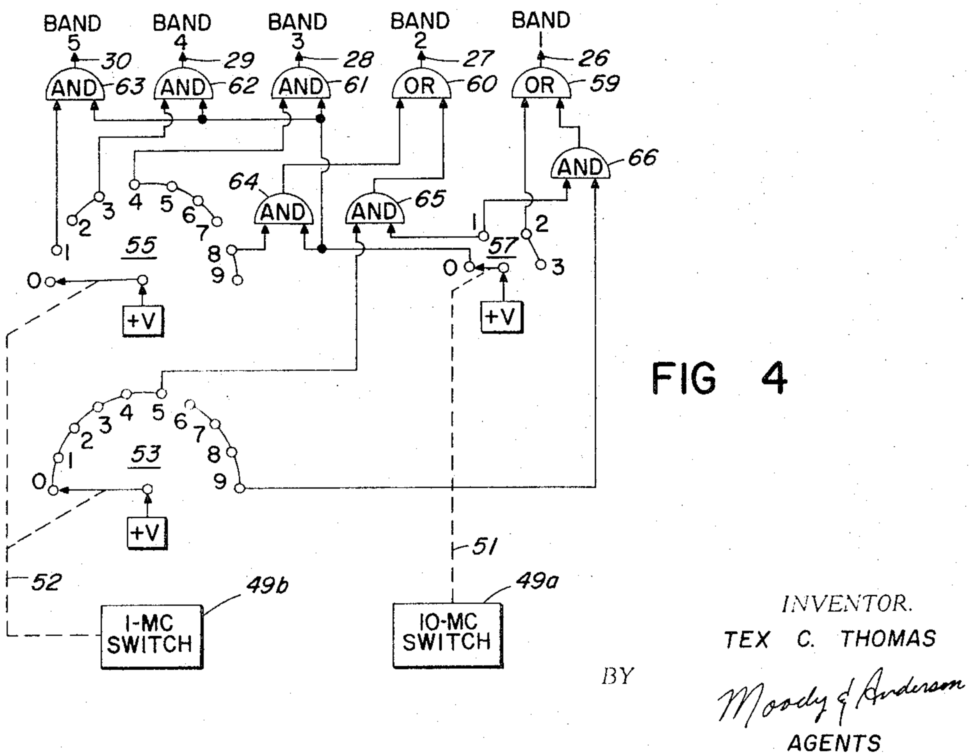
FIGURE 4 illustrates details of a band switch logic network which may be used in the synthesizer of FIGURE 2.

An examination of Table I illustrates that each of the frequency ranges is characterized by a distinctly different combination of 10-mc. switch and 1-mc. switch positions. Therefore a basic logic circuitry as illustrated in FIGURE 4 might be employed which utilizes readout from the 1-mc. and 10-mc. selector switch positions in conjunction with appropriate gating to generate an output gate on one of lines 26 through 30 depending upon the particular octave within which a selected frequency lies. Each of the successive pairs of switch positions for the frequency ranges suggests an AND gating function. Where more than one digit is involved for the 1-mc. switch position, the group of digits suggests an OR function together with an AND function with the associated single switch position of the 10-mc. switch.

FIGURE 4 illustrates a basic embodiment of logic circuitry based upon Table I. The 10-mc. frequency selector switch, **49*a*, positions a switch section 57 to one of the 10-mc. digits under consideration, either 0, 1, 2, or 3. The 1-mc. frequency selector switch, 49*b*, positions a pair of 10 position switch sections 53 and 55, each corresponding to the digits 0 through 9 which define the various 1-mc. digits in the frequency selection. Consider now that the wiper arm of each of the three switch sections is connected to, for example, a positive voltage source. By appropriate interconnection between switch contacts in accordance with the logic of Table I and the incorporation of combining logic, an output is developed on line 30** for frequency selection within band 5, on line 29 for frequency selection within band 4, on line 28 for frequency selection within band 3, on line 27 for frequency selection within band 2 and on line 26 for frequency selection within band 1.

The outputs 26–30 are controlled by output switches 59–63 respectively. Switch 63 is an AND gate receiving an input from position 1 of switch section 55 and position 0 of switch section 57. Output switch 62 is an AND gate receiving input from positions 2 and 3 of switch section 55 and an input from position 0 of switch section 57. Output switch 61 is an AND gate receiving an input for selected positions 4–7 of switch section 55 and from position 0 of switch section 57. Output switch 60 is an OR gate receiving inputs from a pair of AND gates 64 and 65, where AND gate 64 receiving an input from positions 8 and 9 from switch section 55 and from position 0 from switch section 57, and AND gate 65 receives an input from positions 0 through 5 of switch section 53 and an input from position 1 of switch section 57. Finally, output switch 59 is an OR gate receiving one input from positions 2 or 3 of switch section 57 and a second input from an AND gate 66 which receives inputs from position 1 of switch section 57 and from positions 6–9 of switch section 53.

The logic circuitry of FIGURE 4 then effects a gating output on the output line 26–30 in accordance with the particular octave within which the output falls, and thus effects the proper division of the voltage controlled oscillator output. The output frequency is selected by positioning the decade dividers *49a–49e* which comprise the variable digital divider 42. The selected frequency is directly readable from the respective switch positions. The feedback logic 50 associated with the variable digital divider 42 effects appropriate feedback within the counter chain to select the required dividing factor for any selected frequency. From previous discussion, the further division of the voltage controlled oscillator output by the VCO divider 15 under the control of the band switch logic network permits the voltage controlled oscillator 13 to operate only within the highest octave. The fixed division ratio $N_1$ and multiplication factor $N_1$, which respectively precede and follow the variable digital divider 42, allow the digital divider 42 to operate at a frequency which is a predetermined fraction of the frequency at which it would operate were it directly dividing the output 37 from the synthesizer loop.

Although the present invention has been described with respect to particular embodiments thereof it is not to be so limited as changes and modifications may be made therein which fall within the spirit and scope of the invention as defined by the appended claims.

I claim:

1. A digital frequency synthesizer comprising a voltage controlled oscillator, the output of said voltage controlled oscillator being controllable in discrete frequency steps over a predetermined frequency range, the output from said voltage controlled oscillator applied to a frequency dividing means and divided down to a predetermined feedback frequency equal that of said discrete output steps, a reference frequency source having a frequency equal that of said feedback frequency, phase comparison means to which said reference frequency source and said feedback signal are applied, the output from said phase comparison means being applied to said voltage controlled oscillator to complete a phase locked loop between the output and input of said variable controlled oscillator, said frequency dividing means comprising a fixed divider receiving the output from said voltage controlled oscillator and dividing the frequency and phase thereof by a factor $N_1$, a variable digital divider receiving the output from said fixed divider and dividing the output from said fixed divider by a preselected integer N where N is defined as the ratio of the voltage controlled oscillator output frequency to said reference frequency, a fixed frequency multiplier receiving the output from said variable digital divider and multiplying by said preselected integer $N_1$, and the output from said fixed multiplier being applied to said phase comparator for phase comparison with said reference frequency, whereby, for any selected synthesizer output frequency as defined by the product of said selected countdown factor N of said variable digital divider and said reference frequency, the highest frequency at which said variable digital divider operates is reduced by a factor of $N_1$ and synthesizer output frequency steps equal to the reference frequency are maintained.

2. A frequency synthesizer as defined in claim 1 wherein said fixed divider comprises a plurality *n* of binary divider stages cascaded so as to divide by factor $2^n$ to establish the factor $N_1$, said fixed frequency multiplier comprising a one-shot multivibrator receiving the output from said variable digital divider, said one-shot multivibrator having a duty factor set for maximum harmonic content at the multiplication factor $N_1$, a band pass filter receiving the output from said one-shot multivibrator and selecting the harmonic output thereof corresponding to $N_1$ times the output from said variable digital divider.

3. A frequency synthesizer as defined in claim 1 wherein the operating frequency range of said frequency synthesizer is defined by a predetermined number of successive octaves including a highest octave, the output from said voltage controlled oscillator being applied to further frequency dividing means prior to application to said loop feedback dividing means, said further frequency dividing means comprising means to divide the output frequency from said voltage controlled oscillator by successive increasing integer powers of the integer two including the zero power thereof in response to selected output frequencies in the highest octave in said frequency range and successively lower octaves thereof, respectively.

4. A frequency synthesizer as defined in claim 3 wherein said further frequency dividing means comprises a cascaded arrangement of a plurality of (B–1) binary dividers each capable of dividing by a factor of two, where B is the number of octaves defining the operating frequency range, and logic switching means receiving and selectively applying the output from the voltage controlled oscillator with the output from succeeding ones of said binary dividers to the output of said synthesizer in response to selected frequencies in highest octaves in said frequency range and successively lower octaves thereof, respectively.

5. A frequency synthesizer as defined in claim 4 whereby in the countdown factor N of the variable digital divider in the synchronizer feedback loop is established by a plurality of digital frequency selector switches, said logic switching means being responsive to the settings of frequency selector switches effecting predetermined digits of the synthesizer output frequency to selectively apply the output from the voltage controlled oscillator and from one of the successive binary dividers in the further dividing means to the synthesizer output and to the synthesizer feedback loop.

6. A synthesizer as defined in claim 4 wherein said variable digital divider comprises a plurality of decade dividers, frequency selecting switching means associated with said dividers and including a switch to establish each significant digit of the countdown factor N, band switch logic means responsive to the switch positions of predetermined ones of said frequency selector switches to generate an enabling gate signal on an output line in response to selected frequencies within each of said octaves to select either the output from said voltage controlled oscillator or the output from successive ones of said binary dividers in said further dividing means for application to the synthesizer feedback loop.

7. A digital frequency synthesizer comprising a voltage controlled oscillator, the output of said voltage controlled oscillator being controllable in discrete frequency steps over a predetermined frequency range, said frequency range being defined by a predetermined number of successive octaves including a highest octave, the output from said voltage controlled oscillator being applied to a first frequency dividing means, said first frequency dividing means comprising means to divide the output frequency from said voltage controlled oscillator by successive increasing integer powers of the integer two, including the zero power thereof, in response to selected synthesizer output frequencies in the highest octave in said frequency range and successively lower octaves thereof, respectively, the output from said first frequency dividing means being the output from said frequency synthesizer and further applied to a second frequency dividing means for division down to a predetermined feedback frequency equal that of said discrete output steps, a reference frequency source having a frequency equal that of said feedback frequency, a phase comparison means to which said reference frequency source and said feedback signal are applied, the output from said phase comparison means being applied to said voltage controlled oscillator to complete a phase locked loop between the output and input of said voltage controlled oscillator, said second frequency dividing means comprising a variable digital divider adapted to divide by a preselected integer N, where N is defined as the ratio of the voltage controlled oscillator output frequency to said reference frequency, whereby said voltage controlled oscillator, in response to any selected operating frequency within the operating frequency range of synthesizer, operates at a frequency in the highest octave defining said frequency range and the synthesizer output frequency is equal to the voltage controlled oscillator operating frequency divided by one of the successively increasing integer powers of the integer two as effected by said first frequency dividing means in response to synthesizer output frequency selection in a corresponding one of the octaves defining said operating frequency range.

8. A digital frequency synthesizer as defined in claim 7 wherein said first frequency dividing means comprises a cascaded arrangement of a plurality of (B–1) binary dividers each capable of dividing by a factor of two where, B is the number of octaves defining the operating frequency range, and logic switching means receiving and selectively applying the output from the voltage controlled oscillator with the output from succeeding one of said binary dividers to the output of said synthesizer in response to selected frequencies in highest octaves in said frequency range and successively lower octaves thereof, respectively.

9. A digital frequency synthesizer as defined in claim 8 wherein the countdown factor N of the variable digital divider in the synthesizer feedback loop is established by a plurality of digital frequency selector switches, said logic switching means being responsive to the settings of frequency selector switches effecting predetermined digits of the synthesizer output frequency to selectively apply the output from the voltage controlled oscillator and from one of the successive binary dividers in the first dividing means to the synthesizer output and to the synthesizer feedback loop.

10. A digital frequency synthesizer as defined in claim 8 wherein said variable digital divider comprises a plurality of decade dividers, frequency selecting switching means associated with said dividers and including a switch to establish each significant digit of the countdown factor N, band switch logic means responsive to the switch positions of predetermined ones of said frequency selector switches to generate an enabling gate signal on an output line in response to selected frequencies within each of said octaves to select either the output from said voltage controlled oscillator or the output from successive ones of said binary dividers in said first dividing means for application to the synthesizer feedback loop.

No references cited.

ROY LAKE, *Primary Examiner.*

S. H. GRIMM, *Assistant Examiner.*